United States Patent
Menkhoff

(10) Patent No.: US 10,320,366 B2
(45) Date of Patent: Jun. 11, 2019

(54) METHOD FOR PROVIDING A FILTER AND FILTER

(71) Applicant: Intel IP Corporation, Santa Clara, CA (US)

(72) Inventor: Andreas Menkhoff, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 872 days.

(21) Appl. No.: 14/631,937

(22) Filed: Feb. 26, 2015

(65) Prior Publication Data

US 2015/0280690 A1 Oct. 1, 2015

(30) Foreign Application Priority Data

Mar. 28, 2014 (DE) .................. 10 2014 104 463

(51) Int. Cl.
*H03H 17/00* (2006.01)
*H03H 17/02* (2006.01)
*H03H 17/06* (2006.01)

(52) U.S. Cl.
CPC .... *H03H 17/0248* (2013.01); *H03H 17/0657* (2013.01); *H03H 17/0664* (2013.01); *H03H 2017/0072* (2013.01); *H03H 2218/08* (2013.01)

(58) Field of Classification Search
CPC .......... H03H 2218/08; H03H 17/0621; H03H 17/0635–17/0664; H03H 17/0292; H03H 17/0273–17/0279; H03H 2017/0245; H03H 2017/0072
USPC ................. 708/300–301, 305, 313, 316, 322
See application file for complete search history.

(56) References Cited

U.S. PATENT DOCUMENTS

| | | | | | |
|---|---|---|---|---|---|
| 4,377,793 | A | * | 3/1983 | Horna | H03H 21/0012 333/165 |
| 6,163,787 | A | * | 12/2000 | Menkhoff | H03H 17/0279 708/313 |
| 6,532,483 | B1 | * | 3/2003 | Wendel | H03H 17/0292 708/316 |
| 8,296,346 | B2 | * | 10/2012 | Jensen | H03H 17/0664 708/313 |
| 2005/0286668 | A1 | * | 12/2005 | Kubin | H03H 17/0223 375/355 |
| 2006/0056553 | A1 | * | 3/2006 | Bruekers | H03H 17/0275 375/350 |

(Continued)

FOREIGN PATENT DOCUMENTS

DE 102004045893 A1 3/2006

OTHER PUBLICATIONS

Julius O. Smith III, "Introduction to Digital Filters with Audio Applications", W3K Publishing, 2007, retrieved from https://www.dsprelated.com/freebooks/filters.*

(Continued)

*Primary Examiner* — Matthew D Sandifer
(74) *Attorney, Agent, or Firm* — Eschweiler & Potashnik, LLC

(57) ABSTRACT

A filter having an impulse response including a first partial impulse response and a second partial impulse response includes a supplementary filter having a supplementary impulse response. A first filter has the first partial impulse response using an output of the supplementary filter as an input and a second filter has the second partial impulse response using an output of the supplementary filter as an input.

21 Claims, 8 Drawing Sheets

(56) References Cited

U.S. PATENT DOCUMENTS

2008/0043889 A1* 2/2008 Menkhoff .......... H03H 17/0275
                                                    375/350

OTHER PUBLICATIONS

Alan V. Oppenheim , Alan S. Willsky , S. Hamid Nawab, Signals & systems (2nd ed.), Prentice-Hall, Inc., Upper Saddle River, NJ, 1996.*
Alan V. Oppenheim, Ronald W. Schafer, and John R. Buck, Discrete-Time Signal Processing (2nd Ed.), Prentice-Hall, Inc., Upper Saddle River, NJ, 1999.*
Signal Processing Stack Exchange, "What is meant by a system's 'impulse response' and 'frequency response'?", Oct. 2011, retrieved from https://dsp.stackexchange.com/questions/536/what-is-meant-by-a-systems-impulse-response-and-frequency-response.*
German Examination Report dated Dec. 22, 2014 in connection with German Patent Application No. 102014104463.0.

* cited by examiner

METHOD FOR PROVIDING A FILTER AND FILTER

FIELD

Examples described herein relate to filters for filtering a signal and to methods to provide filters.

BACKGROUND

Applications in which signals are digitally filtered are numerous. For example, digital filters are often used to interpolate or decimate signals, i.e. to increase or decrease the number of samples used for a given segment of the signal. One application using both interpolation and decimation filters are digital radio frequency (RF) transmitters and receivers. In some implementations, decimation filters are used to process a signal before a digital-to-analog converter (DAC) or to interpolate a signal of an analog-to-digital converter (ADC) to be used with higher sampling frequencies. The power consumption of a digital filter is proportional to the sampling rate and, when the sampling rate increases as in today's mobile telecommunication applications, the power consumption of the digital filters may begin to contribute significantly to an overall power consumption of a device. In mobile phones or handsets using such a type of radio frequency transmitters, power consumption is to be maintained as low as possible in order to enable significant standby times. Hence, also the power consumption of the digital filters should be maintained low. One approach to decrease the complexity and the number of components used to implement a finite impulse response filter with a given impulse response is to implement the filter as a polyphase filter. In polyphase form, at least two elementary filters are processed in parallel, while each of the parallel filters has a lower order. The single elementary FIR-filters are processed in parallel and with one or multiple samples delay with respect to each other. Using polyphase filter layouts may allow to use the individual sub- or elementary filters of the polyphase filter with a lower sampling rate than the one of overall filter. Using polyphase implementations for filters having a given impulse response may so allow to decrease the number of processing components or entities when the filter is implemented in hardware.

For example due to the ongoing increase of the sampling frequency, there may be a desire to furthermore decrease the complexity of the filter having a predetermined impulse response and to provide an implementation having a lower number of processing entities.

BRIEF DESCRIPTION OF THE DRAWINGS

Some embodiments of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples are shown by way of example in the figures and will herein be described in detail. It should be understood, however, that there is no intent to limit examples to the particular forms disclosed, but on the contrary, further examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
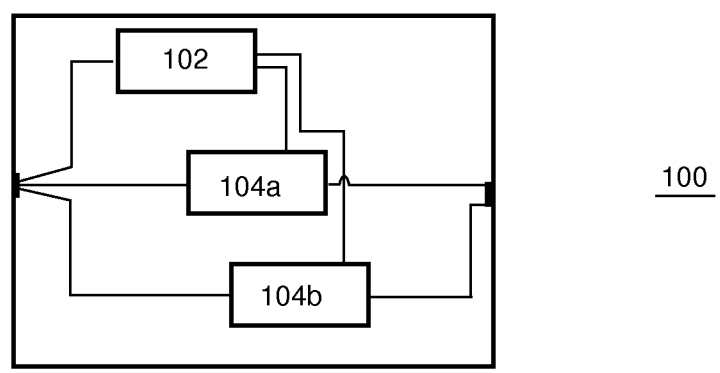
FIG. 1 illustrates an example of a filter.

FIG. 1 illustrates an example of a filter 100 having an impulse response comprising a first partial impulse response and a second partial impulse response. An example of a filter 100 as illustrated in FIG. 1 may be interpreted similar to a polyphase filter having two polyphases, wherein the first polyphase contributes with the first partial impulse response and the second polyphase contributes with the second partial impulse response to the impulse response of the filter.

The filter 100 comprises a supplementary filter 102 having a supplementary impulse response, a first filter 104a and a second filter 104b. The first filter 104a has the first partial impulse response if using an output of the supplementary filter 102 as an input and the second filter 104b has the second partial impulse response if using an output of the supplementary filter 102 as an input. In other words, a further supplementary filter 102 is used having a supplementary impulse response and a first filter 104a and a second filter 104b are used and designed so as to use the output of the supplementary filter 102 as an input that provides a common contribution to the impulse response of the first filter 104a and the second filter 104b. The use of the supplementary filter 102 may allow to decrease the complexity of a hardware implementation of the filter 100 further as compared to a conventional polyphase implementation. The filter may be implemented using fewer components or processing entities than a conventional solution where each of the first filter and the second filter individually and redundantly generates the contribution being identified as common contribution.

Using the output of the supplementary filter as an input to a further filter (first or second filters) shall be understood to cover the use of the output of the complete filter chain of the supplementary filter or an output of a particular processing component within the supplementary filter as an input to an arbitrary processing component of the further filter. For example, an output of the supplementary filter may be used as one input to a processing component (e.g. an adder, multiplier or delay element) within the further filter, while additional inputs to the same processing component may be provided by other processing components of the further filter itself. Further, an output of the supplementary filter is not necessarily limited to an output of the last processing component of the supplementary filter. According to some examples, an output of a processing component at an arbitrary position within the supplementary filter may be used as an additional input to a processing component at an arbitrary position within the first filter or the second filter. Processing components may be understood as any component, circuitry, logic or the like which is operable to process a digital sample value or a bit or the like within the filter.

According to some examples, an output of the filter 100 is provided by an output of the first filter 104a at uneven sample positions and by an output of the second filter 104b at even sample positions. That is, the output of the first filter 104a and the second filter 104b are used in a manner similar or identical to polyphase filters. In other words, the impulse response of the filter 100 is given by the samples of the first partial impulse response at uneven sample positions and by the samples of the second partial impulse response at even sample positions. According to some examples, a filter 100 is used as interpolation filter so that an input sample sequence to the filter is provided at an input sample frequency and the output of the first filter is used at a first sample period and the output of the second filter is used as an output at a second, subsequent sample period, while the output sampling frequency is twice the input sampling frequency. Similarly, further examples of filters are used as a decimator in which an input to the first filter 104a is provided as a first sample of an input sample sequence while an input to the second filter 104b is provided as a second, subsequent sample of the input sample sequence provided at an input sample frequency. The first and second filters 104a, 104b are operated at an output sampling frequency which is one half of the input sample frequency and the outputs of the first filter 104a and the second filter 104b are summed up to provide an output of the filter. Therefore, hardware costs may be reduced in interpolating applications as well as in decimating applications.

Figure 2A:
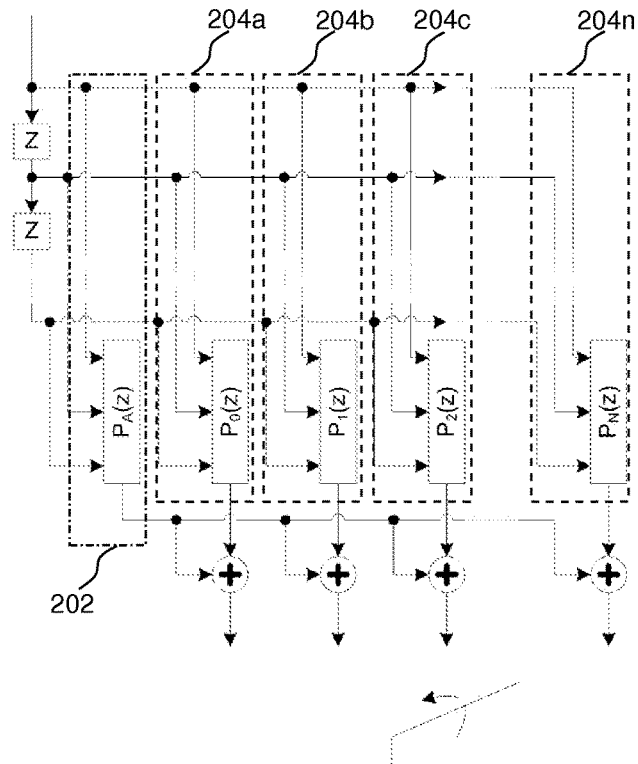
FIG. 2a illustrates an example of a filter used as an interpolator.

FIG. 2a illustrates an example of an interpolation filter, while FIG. 2a illustrates an example for a decimation filter.

In the example of FIG. 2a, a first filter 204a, a second filter 204b, a third filter 204c up to an n-th filter 204n are used in parallel in a poly-phase filter set-up. The output of the individual poly-phases 204a to 204n are subsequently provided at an output of the filter in a serial fashion so as to, for example, increase the sampling frequency at the output of the filter by a factor of n. A supplementary filter 202 has an impulse response which can be used as an additional input to all of the filters 204a to 204n. That is, an output of the supplementary filter 202 can be used by each of the filters 204a to 204n and by hardware components used therein.

Figure 2B:
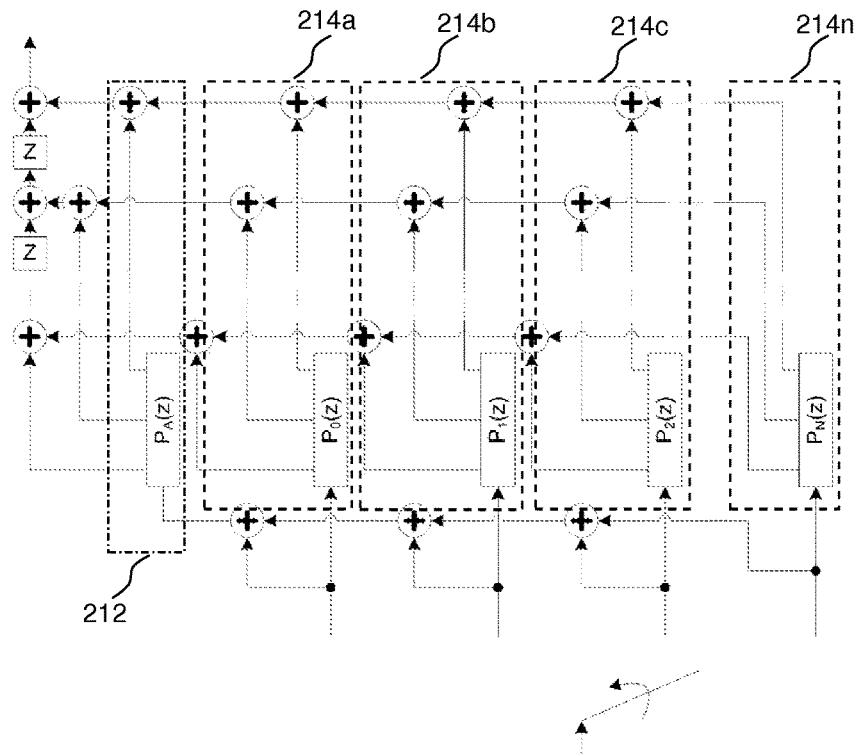
FIG. 2b illustrates an example of a filter used as a decimator.

Similarly, filters 214a to 214n within the decimation filter of FIG. 2b are supplemented by the supplementary filter 212 providing a common contribution to the desired impulse responses of filters 214a to 214n.

In other words, according to some examples, a filter is divided into n polyphases or represented by n sub-filters. Further, a supplementary filter is provided which has a supplementary impulse response which can be used as a joint contribution to the impulse response of at least two of the n sub-filters. In some examples, one or more common poly-phases (supplementary filters) are extracted and added to the other filters (n filters 204a to 204n, or 214a to 214n). FIG. 2a illustrates the concept for an interpolation filter while FIG. 2b illustrates the concept for a decimation filter.

FIGS. 3 to 8 illustrate examples of filters having an impulse response with respect to a function, which is $(1-z^{-1})^N$ with N being an integer number. Filters having impulse responses with N being an integer number, for example N equaling 3, 4 or 5, exhibit beneficial characteristics making them particularly suitable to be used as interpolation or decimation filters. For example, mobile telephone applications use filters having such impulse responses as interpolators or decimators before or next to analog-to-digital converters and digital-to-analog converters within the digital signal processing path. Those filters run at the highest available digital frequencies and, hence, should be implemented as efficiently as possible. Depending on the supported mobile telecommunication standards, a single transceiver may use multiple instances of those filters inside a transmit signal chain or a receive signal chain. Therefore, one mobile telephone may use even 36 or more instances of such filters. Reducing the energy consumption of a single filter may, together with a high number of filters within one mobile device, sum up to a significant saving of energy when the individual filters are implemented according to the examples described herein since these save one or more processing components as compared to conventional implementations.

Figure 3:
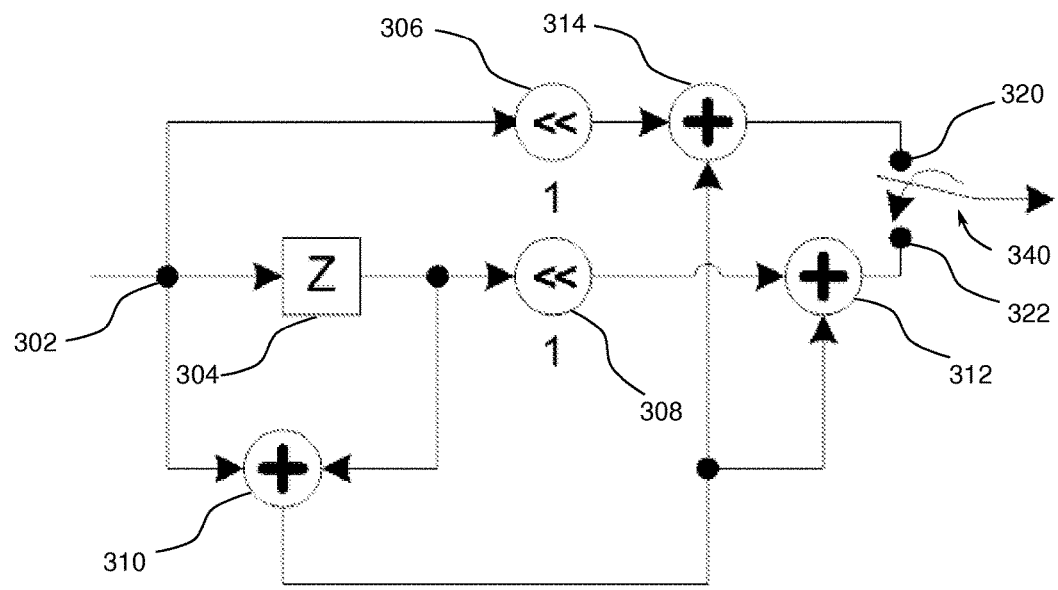
FIG. 3 illustrates an example of a filter used as an interpolator.
Figure 4:
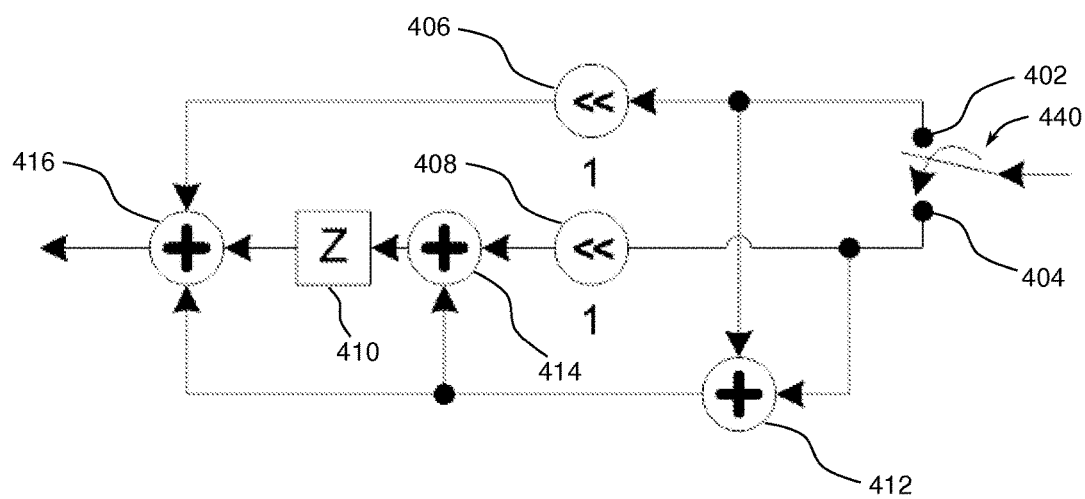
FIG. 4 illustrates an example of a filter used as a decimator.
Figure 5:
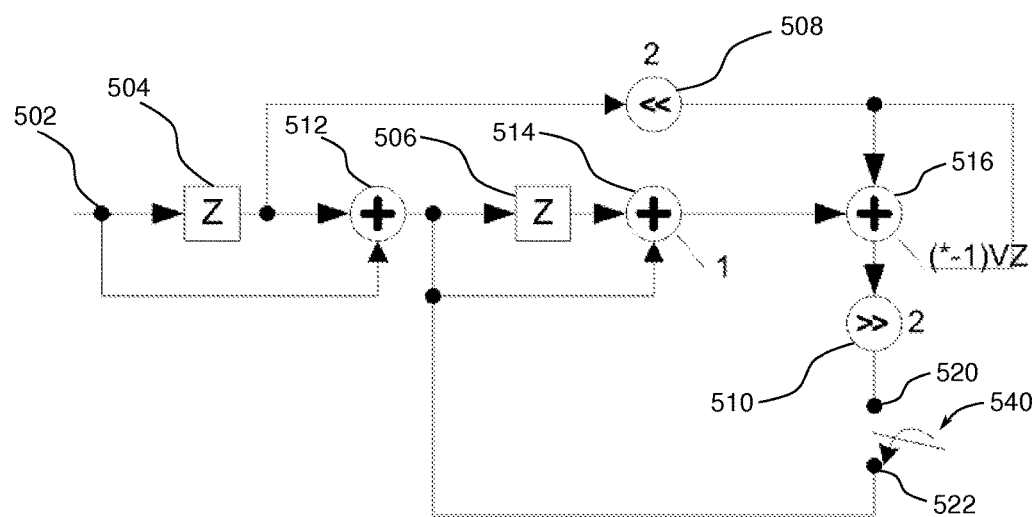
FIG. 5 illustrates a further example of a filter used as an interpolator.
Figure 6:
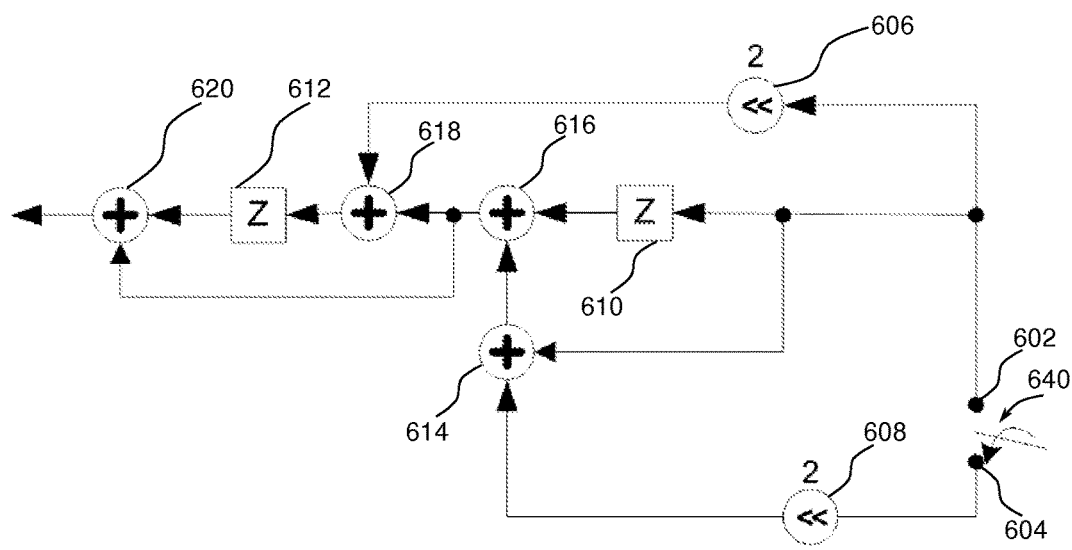
FIG. 6 illustrates a further example of a filter used as a decimator.
Figure 7:
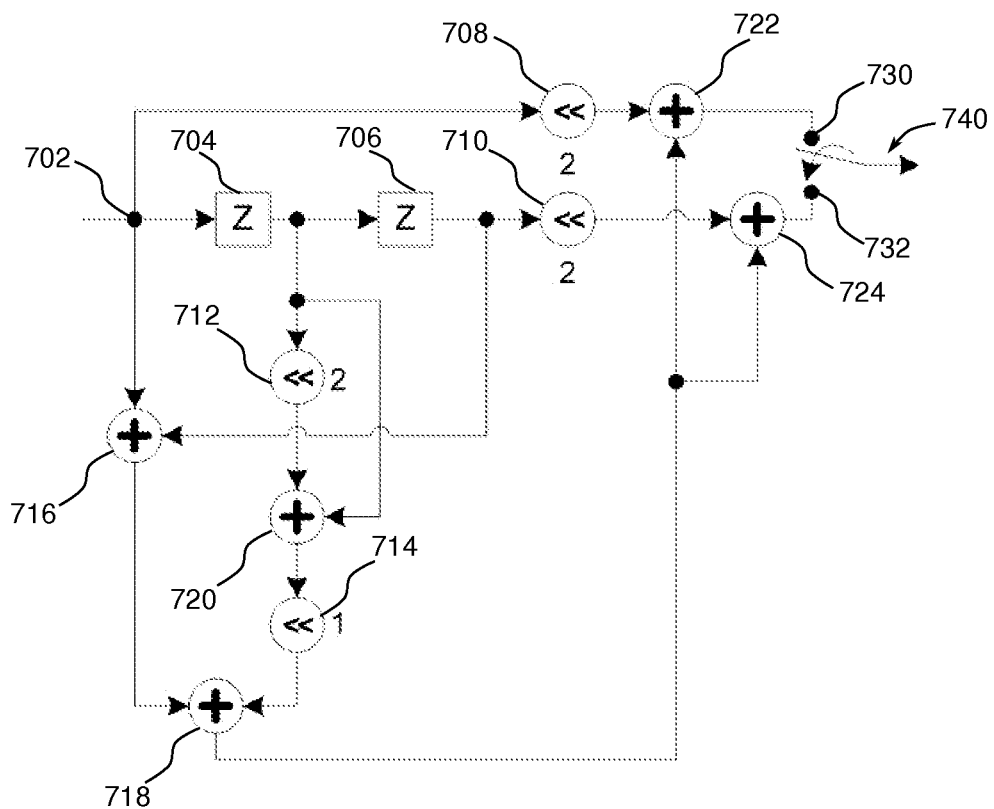
FIG. 7 illustrates a further example of a filter used as an interpolator.
Figure 8:
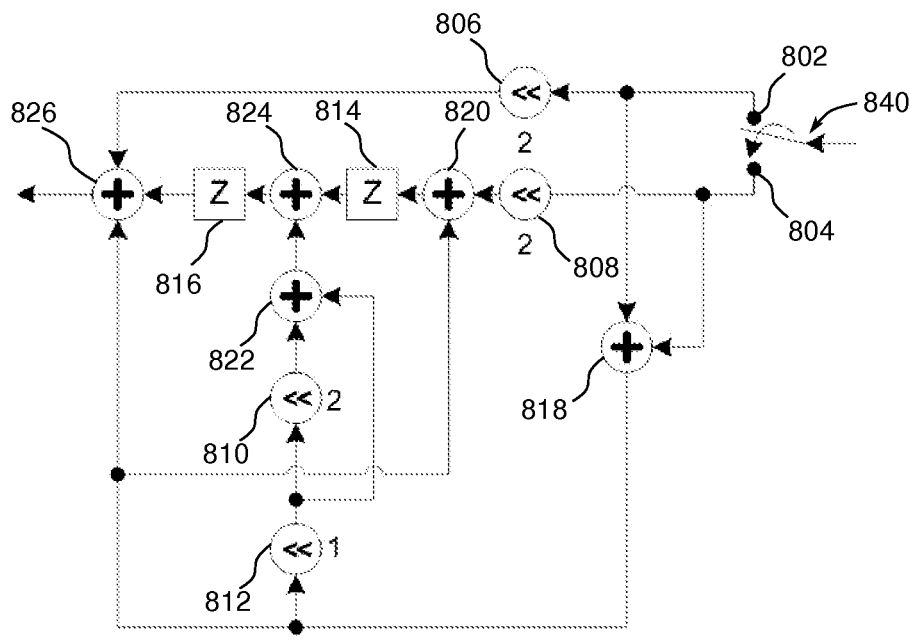
FIG. 8 illustrates a further example of a filter used as a decimator.

FIGS. 3 and 4 illustrate examples of filters where N=3, FIGS. 5 and 6 illustrate examples of filters where N=4 and FIGS. 7 and 8 illustrate examples of filters where N=5. The filters are based on a poly-phase approach, wherein a first filter and a second filter contribute to the impulse response of the filter, while a supplementary filter having a supplementary filter impulse response serves as an additional input and/or contribution for/to the first filter and/or the second filter.

The impulse response of the filter illustrated in FIG. 3 is dependent on a function: $1+3z^{-2}+3z^{-2}+z^{-3}$. The first filter has an impulse response of [2 0]; the second filter has an impulse response of [0 2] and the supplementary filter has an impulse response of [1 1]. In the commonly used notation, a filter having an impulse response of, e.g. [1 2] provides an output of 1 at a first sample time and an output of 2 at a second, subsequent sample time when receiving 1 as an input at the first sample time and no input else.

The filter of FIG. 3 serves as an interpolation filter to, e.g., double the sampling rate. The filter comprises an input node 302, a delay element 304, a first multiplier 306, a second multiplier 308, a first adder 310, a second adder 312, a third adder 314, a first output node 320 and a second output node 322. The input node 302 is coupled to an input of the first adder 310, to an input of the delay element 304 and to an input of the first multiplier 306. An output of the first multiplier 306 is coupled to an input of the third adder 314. An output of the third adder 314 is coupled to the first output node 320. An output of the delay element 304 is coupled to an input of the second multiplier 308 and to an input of the first adder 310. An output of the first adder 310 is coupled to an input of the third adder 314 and to an input of the second adder 312. An output of the second multiplier 308 is coupled to an input of the second adder 312, and an output of the second adder 312 is coupled to the second output node 322. Coupling element 340 is configured to couple the first output node to a common output node of the filter at a first sampling interval and the second output node to a common output node of the filter at a subsequent second sampling interval.

Adders, delay elements and multipliers are digital processing components implemented in hardware and performing mathematical and/or logical operations. An adder is configured to sum up all quantities provided at its multiple inputs. A delay element z is configured to receive a digital quantity at its input and to provide the quantity or number at its output after a predetermined time period. In time discrete processing implementations, the time period is given in multiples of the sample time. The delay elements characterized by "Z" delay the input quantity one sample time, which is equivalent to an impulse response according to a function of $z^{-1}$. Multipliers multiply the input quantity by a predetermined factor and provide a multiplied quantity at their output. In a hardware implementation using binary representations of digital quantities, multipliers multiplying by powers of two can be efficiently implemented by registers shifting their content. This is illustrated in the figures, were multipliers denoted "1" shift by 1 bit and, hence, multiply by 2, while multipliers denoted "2" multiply by 4.

The filter of FIG. 4 serves as a decimation filter and comprises a first input node 402, a second input node 404, a first multiplier 406, a second multiplier 408, a delay element 410, a first adder 412, a second adder 414 and a third adder 416. The first input node 402 is coupled to an input of the first multiplier 406 and to an input of the first adder 412. The second input node 404 is coupled to an input of the second multiplier 408 and to an input of the first adder 412. An output of the first multiplier 406 is coupled to an input of the third adder 416. An output of the second multiplier 408 is coupled to an input of the second adder 414. An output of the second adder 414 is coupled to an input of the delay element 410. An output of the delay element 410 is coupled to an input of the third adder 416. An output of the first adder 412 is coupled to an input of the second adder 414 and to an input of the third adder 416. Coupling element 440 is configured to couple the first input node to a common input node of the filter at a first sampling interval and the second input node to a common input node of the filter at a subsequent second sampling interval.

FIGS. 5 and 6 illustrate examples of filters where N=4, corresponding to an impulse response based on a function of: $1+4z^{-1}+6z^{-2}+4z^{-3}+z^{-4}$. The first filter has an impulse response of $h_1$=[0 4 0], the second filter has an impulse response of $h_2$=[4] and the supplementary filter has an impulse response of $h_{sup}$=[1 1]. The first resulting polyphase is $h_{sup}$* $h_{sup}$ +[0 4 0] (the symbol '*' means convolution), the second resulting polyphase is $h_{sup}$ ×4.

The interpolation filter of FIG. 5 comprises an input node 502, a first delay element 504, a second delay element 506, a first multiplier 508, a second multiplier 510, a first adder 512, a second adder 514, a third adder 516, a first output node 520 and a second output node 522. The input node 502 is coupled to an input of the first adder 512 and to an input of the first delay element 504. An output of the first delay element 504 is coupled to an input of the first adder 512 and to an input of the first multiplier 508. An output of the first multiplier 508 is coupled to an input of the third adder 516. An output of the first adder 512 is coupled to an input of the second delay element 506, an input of the second adder 514 and to the second output node 522. An output of the second delay element 506 is coupled to an input of the second adder 514. An output of the second adder 514 is coupled to an input of the third adder 516. An output of the third adder 516 is coupled to an input of the second multiplier 510. An output of the second multiplier 510 is coupled to the second output node 522. Coupling element 540 is configured to couple the first output node to a common output node of the filter at a first sampling interval and the second output node to a common output node of the filter at a subsequent second sampling interval.

The decimation filter of FIG. 6 comprises a first input node 602, a second input node 604, a first multiplier 606, a second multiplier 608, a first delay element 610, a second delay element 612, a first adder 614, a second adder 616, a third adder 618 and a fourth adder 620. The first input node 602 is coupled to an input of the first multiplier 606, an input of the first delay element 610 and an input of the first adder 614. The second input node 604 is coupled to an input of the second multiplier 608. An output of the second multiplier 608 is coupled to an input of the first adder 614. An output of the first adder 614 is coupled to an input of the second adder 616. An output of the first delay element 610 is coupled to an input of the second adder 616. An output of the first multiplier 606 is coupled to an input of the third adder 618. An output of the second adder 616 is coupled to an input of the third adder 618 and an input of the fourth adder 620. An output of the third adder 618 is coupled to an input of the second delay element 612. An output of the second delay element 612 is coupled to an input of the fourth adder 620. Coupling element 640 is configured to couple the first input node to a common input node of the filter at a first sampling interval and the second input node to a common input node of the filter at a subsequent second sampling interval.

FIGS. 7 and 8 illustrate examples of filters where N=5, corresponding to an impulse response of a function, the function comprising: $1+5z^{-1}+10z^{-2}+10z^{-3}+5z^{-4}+z^{-5}$. The first filter has an impulse response of [4 0 0]; the second filter has an impulse response of [0 0 4], and the supplementary filter has an impulse response of [1 10 1].

The interpolation filter of FIG. 7 comprises an input node 702, a first delay element 704, a second delay element 706, a first multiplier 708, a second multiplier 710, a third multiplier 712, a fourth multiplier 714, a first adder 716, a second adder 718, a third adder 720, a fourth adder 722, a fifth adder 724, first output node 730 and a second output node 732. The input node 702 is coupled to an input of the first delay element 704, an input of the first multiplier 708 and an input of the first adder 716. An output of the first multiplier 708 is coupled to an input of the fourth adder 722. An output of the fourth adder 722 is coupled to an input of the first output node 730. An output of the first adder 716 is coupled to an input of the second adder 718. An output of the first delay element 704 is coupled to an input of the second delay element 706, an input of the third multiplier 712 and an input of the third adder 720. An output of the third multiplier 712 is coupled to an input of the third adder 720. An output of the third adder 720 is coupled to an input of the fourth multiplier 714. An output of the fourth multiplier 714 is coupled to an input of the second adder 718. An output of the second adder 718 is coupled to an input of the fourth adder 722 and an input of the fifth adder 724. An output of the second delay element 706 is coupled to an input of the first adder 716 and to an input of the second multiplier 710. An output of the second multiplier 710 is coupled to an input of the fifth adder 724 and an output of the fifth adder 724 is coupled to an input of the second output node 732. Coupling element 740 is configured to couple the first output node to a common output node of the filter at a first sampling interval and the second output node to a common output node of the filter at a subsequent second sampling interval.

The decimation filter of FIG. 8 comprises a first input node 802, a second input node 804, a first multiplier 806, a second multiplier 808, a third multiplier 810, a fourth multiplier 812, a first delay element 814, a second delay element 816, a first adder 818, a second adder 820, a third adder 822, a fourth adder 824 and a fifth adder 826. The first input node 802 is coupled to an input of the first multiplier 806 and an input of the first adder 818. The second input node 804 is coupled to an input of the second multiplier 808 and to an input of the first adder 818. An output of the first adder 818 is coupled to an input of the fourth multiplier 812, an input of the second adder 820 and an input of the fifth adder 826. An output of the first multiplier 806 is coupled to an input of the fifth adder 826. An output of the second multiplier 808 is coupled to an input of the second adder 820. An output of the second adder 820 is coupled to an input of the delay element 814. An output of the delay element 814 is coupled to an input of the fourth adder 824. An output of the fourth multiplier 812 is coupled to an input of the third multiplier 810 and an input of the third adder 822. An output of the third multiplier 810 is coupled to an input of the third adder 822. An output of the third adder 822 is coupled to an input of the fourth adder 824. An output of the fourth adder 824 is coupled to an input of the second delay element 816 and an output of the second delay element 816 is coupled to an input of the fifth adder 826. Coupling element 840 is configured to couple the first input node to a common input node of the filter at a first sampling interval and the second input node to a common input node of the filter at a subsequent second sampling interval.

Figure 9:
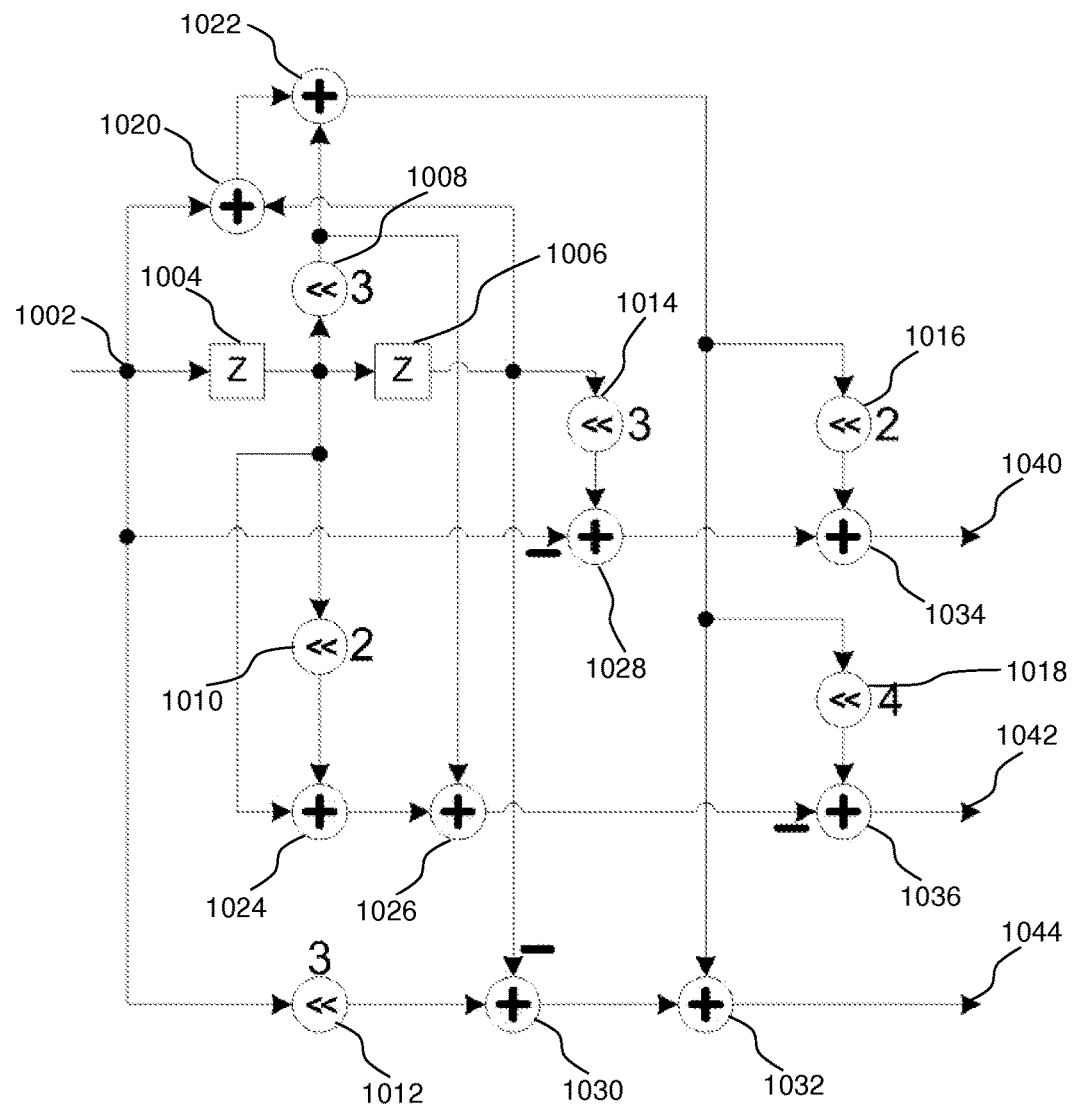
FIG. 9 illustrates a further example of a filter used in an interpolator.

While the previous Figures illustrate filters having a first and a second filter, i.e. filters which are based on a polyphase approach having two polyphase filters, FIG. 9 illustrates a filter having three polyphases. This is meant to illustrate that further examples of filters may be provided which are based on an arbitrary number of polyphases together with one or more supplementary filters.

The interpolation filter of FIG. 9 comprises an input node 1002, a first delay element 1004, a second delay element 1006, a first multiplier 1008, a second multiplier 1010, a third multiplier 1012, a fourth multiplier 1014, a fifth multiplier 1016, a sixth multiplier 1018, a first adder 1020, a second adder 1022, a third adder 1024, a fourth adder 1026, a fifth adder 1028, a sixth adder 1030, a seventh adder 1032, an eight adder 1034, a ninth adder 1036, a first output node 1040, a second output node 1042 and a third output node 1044. In the configuration illustrated in FIG. 9, the filter comprises a first filter having an impulse response $h_1=[-1\ 0\ 8]$, a second filter having an impulse response $h_2=[8\ 0\ -1]$, a third filter having an impulse response $h_3=[0\ -13\ 0]$ and a supplementary filter having an impulse response $h_{sup}=[1\ 8\ 1]$. The first polyphase is constituted by $h_1+2\times h_{sup}$, the second polyphase $h_2+2\times h_{sup}$ and the third polyphase by $h_3+4\times h_{sup}$.

Figure 10:
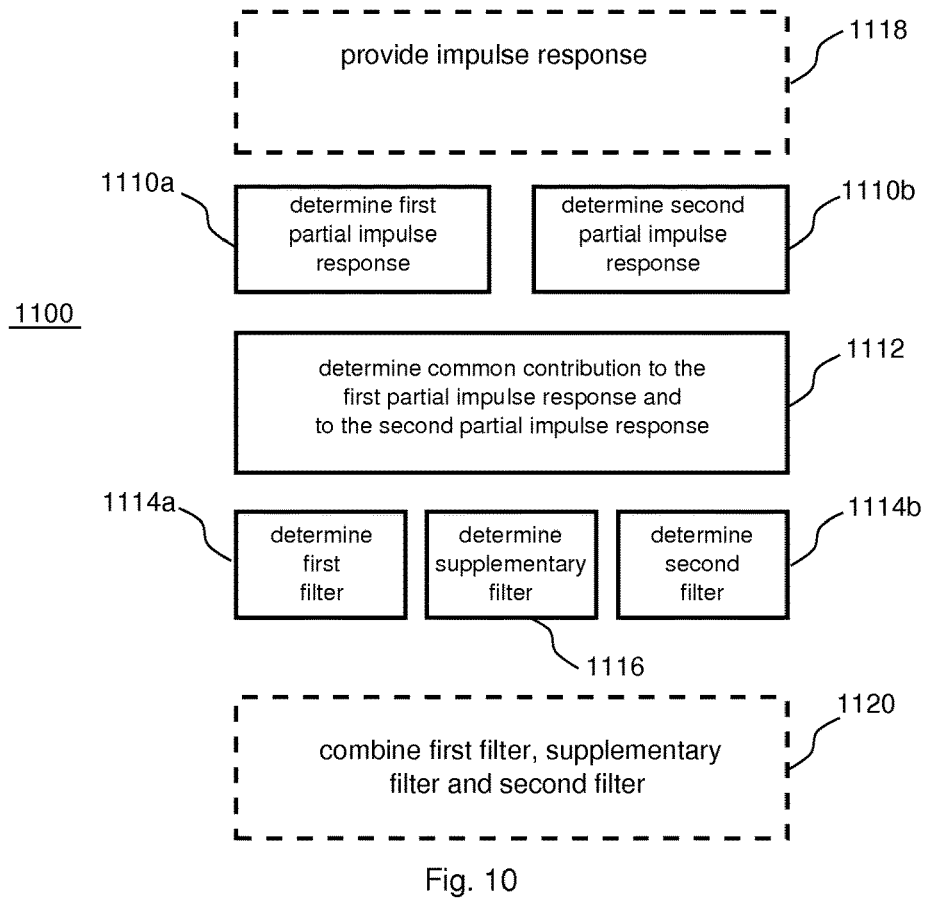
FIG. 10 illustrates an example of a method for providing a filter.

FIG. 10 illustrates a flowchart of an example of a method for providing a filter having a given impulse response. Based on the given impulse response, a first partial impulse response contributing to the impulse response is determined at 1110a. A second partial impulse response contributing to the impulse response is generated at 1110b. In 1112, a common contribution to the first partial impulse response and the second partial impulse response is determined. Based on the determined common contribution, a supplementary filter providing the common contribution as a supplementary impulse response is determined in 1116.

In 1114a, a first filter providing the first partial impulse response using the common contribution of the supplementary filter as an input is determined, while a second filter providing the second partial impulse response using the common contribution of the supplementary filter as an input is determined in 1114b. In summary, a filter having a given impulse response is provided or designed by additionally determining a common contribution to the impulse responses of, for example, a first filter and a second filter of a polyphase filter representation.

In a further optional step 1120, the supplementary filter, the first filter and the second filter are combined to provide the filter in that an output of the supplementary filter is fed to the input of one or more processing components within the first filter and the second filter. The first filter and the second filter utilize the output of the supplementary filter appropriately in order to provide or generate the required first partial impulse response and second partial impulse response, respectively.

Conventional polyphase filters having two poly-phases and being of third, fourth and fifth filter order require about 33% to 38% more adders or processing components than the examples described in FIGS. 3 to 8, although having the same impulse response and identical filter characteristics. The examples of filters of FIGS. 3 to 8 may serve to save a significant amount of energy while operating in, for example, mobile phones or wireless transceivers.

For example, using an interpolation by a factor of 4 and a corresponding decimation may, for example, save 0.67 mA at a sampling frequency of 156 MHz, considering the filters for I and Q together for a mobile telecommunications example. In one of today's LTE compliant (Long Term Evolution) transceivers, multiple instances of those filters may be used. Just as an example, a receive path may need to consider three channels, two spatial signal paths in a MIMO approach, two stages and two filters for I and Q each, which sums up to 24 instances of the filters. Likewise, in the transmit data path, a filter may be required in the I and Q data path, in the envelope tracking path and with four stages, which sums up to 12 instances. Assuming a total of 36 filters of the above example, the total energy saving sums up 9.79 to 10 mA per mobile device. A saving of such a dimension may clearly contribute to extend the stand-by times of the mobile device. Filters as disclosed herein may, hence, provide great benefits with respect to energy consumption in, for example, mobile phones according to the long-term evolution (LTE) standard.

Figure 11:
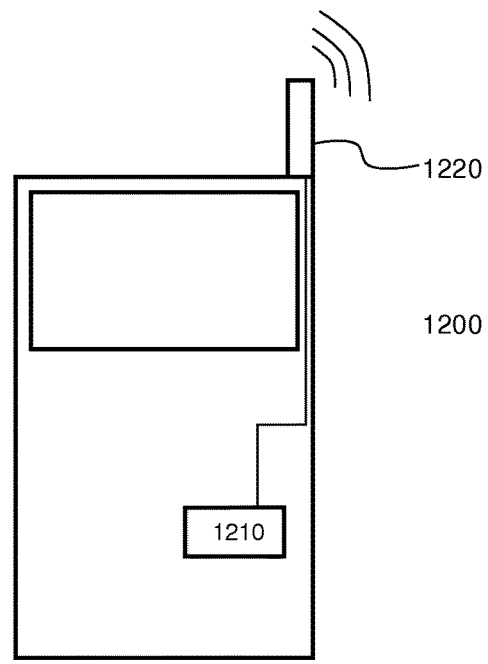
FIG. 11 illustrates an example of a mobile phone comprising at least one filter.

FIG. 11 schematically illustrates an example of a mobile telecommunications device or a user equipment or mobile phone 1200 of a mobile telecommunications network. The mobile phone 1200 comprises a transceiver 1210 using one or multiple examples of filters within its transmit or receive paths. The transceiver 1210 is coupled to an antenna 1220 used to send and receive the wireless communication signal of the mobile telecommunications device 1200. Mobile telecommunication devices or mobile phones 1200 using examples of filters as described herein may have a significantly lower energy consumption than devices using conventional filters.

Figure 12:
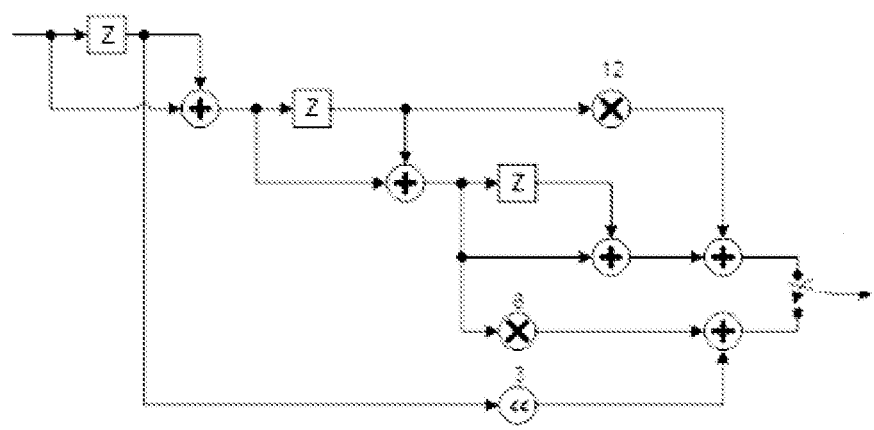
FIG. 12 illustrates a further example of a filter used in an interpolator

FIGS. 12 illustrates a further example of a filter 1300 where N=6, corresponding to an impulse response of a function, the function comprising: $1+6z^{-1}+15z^{-2}+20z^{-3}+15z^{-4}+6z^{-5}+z^{-6}$. The supplementary filter has an impulse response of $h_{sup}=[1\ 2\ 1]$, the first polyphase has an impulse response of $h_{sup}*[1\ 1]+[0\ 12\ 12\ 0]$; the second polyphase has an impulse response of $h_{sup} \times 6+[0\ 8]$.

Since the individual components of the filters are equal to those of the previously discussed filters, a detailed discussion of the filter or interpolator is omitted. It is further noted that, similar to the previously discussed implementations, the impulse responses and the corresponding first, second and supplementary filters may also be used to build a decimation filter matching the interpolation filter of FIG. 12.

Example 1 is a filter having an impulse response comprising a first partial impulse response and a second partial impulse response, the filter comprising a supplementary filter having a supplementary impulse response; a first filter having the first partial impulse response using an output of the supplementary filter as an input; and a second filter having the second partial impulse response using an output of the supplementary filter as an input.

In example 2, in the filter of example 1, the samples of the impulse response are given by samples of the first partial impulse response at uneven sample positions and by samples of the second partial impulse response at even sample positions.

In example 3, in the filter of example 1, the impulse response is given by positive integer powers $(1-z^{-1})^N$ with N being a positive integer number and $z^{-1}$ denoting a delay by a single sampling period.

In example 4, in the filter of example 3, N=3 and the first filter has an impulse response of [2 0]; the second filter has an impulse response of [0 2]; and the supplementary filter has an impulse response of [1 1].

In example 5, the filter of example 4 optionally further comprises an input node, a delay element, a first multiplier, a second multiplier, a first adder, a second adder, a third adder, a first output node and a second output node, wherein the input node is coupled to an input of the first adder, an input of the delay element (304 and an input of the first multiplier (306); an output of the first multiplier is coupled to an input of the third adder; an output of the third adder is coupled to the first output node; an output of the delay element is coupled to an input of the second multiplier and to an input of the first adder; an output of the first adder is coupled to an input of the third adder and to an input of the second adder; an output of the second multiplier (308 is coupled to an input of the second adder (312; and an output of the second adder (312) is coupled to the second output node.

In example 6, the filter of example 4 optionally further comprises a first input node, a second input node, a first multiplier, a second multiplier, a delay element, a first adder (412, a second adder (414) and a third adder, wherein the first input node is coupled to an input of the first multiplier and to an input of the first adder; the second input node is coupled to an input of the second multiplier and to an input of the first adder; an output of the first multiplier is coupled to an input of the third adder; an output of the second multiplier is coupled to an input of the second adder; an output of the second adder is coupled to an input of the delay element; an output of the delay element is coupled to an input of the third adder; an output of the first adder is coupled to an input of the second adder and to an input of the third adder.

In example 7, in the filter of claim 5 or 6, the first multiplier and the second multiplier are configured to perform a multiplication by two.

In example 8, in the filter of example 3, N=4 and the first filter has an impulse response of [0 4 0]; the second filter has an impulse response of [4]; and the supplementary filter has an impulse response of [1 1].

In example 9, the filter of example 8 optionally further comprises an input node, a first delay element, a second delay element, a first multiplier, a second multiplier, a first adder, a second adder, a third adder, a first output node and a second output node, wherein the input node is coupled to an input of the first adder and to an input of the first delay element; an output of the first delay element is coupled to an input of the first adder an input of the first multiplier; an output of the first multiplier is coupled to an input of the third adder; an output of the first adder is coupled to an input of the second delay element, an input of the second adder and to the second output node; an output of the second delay element is coupled to an input of the second adder; an output of the second adder is coupled to an input of the third adder; an output of the third adder is coupled to an input of the second multiplier; and an output of the second multiplier is coupled to the second output node.

In example 10, the filter of example 8 optionally further comprises first input node, a second input node, a first multiplier, a second multiplier, a first delay element, a second delay element, a first adder, a second adder, a third adder and a fourth adder, wherein the first input node is coupled to an input of the first multiplier, an input of the first delay element and an input of the first adder; the second input node is coupled to an input of the second multiplier; an output of the second multiplier (608 is coupled to an input of the first adder (614); an output of the first adder is coupled to an input of the second adder; an output of the first delay element is coupled to an input of the second adder; an output of the first multiplier is coupled to an input of the third adder; an output of the second adder is coupled to an input of the third adder and an input of the fourth adder; an output of the third adder is coupled to an input of the second delay element; and an output of the second delay element is coupled to an input of the fourth adder.

In example 11, in the filter of example 9 or 10, the first multiplier and the second multiplier are configured to perform a multiplication by four.

In example 12, in the filter of example 3, N=5 and the first filter has an impulse response of [4 0 0]; the second filter has an impulse response of [0 0 4]; and the supplementary filter has an impulse response of [1 10 1].

In example 13, the filter of example 12 optionally further comprises an input node (702, a first delay element (704, a second delay element (706), a first multiplier, a second multiplier, a third multiplier, a fourth multiplier, a first adder, a second adder, a third adder, a fourth adder, a fifth adder, first output node and a second output node, wherein the input node is coupled to an input of the first delay element, an input of the first multiplier and an input of the first adder; an output of the first multiplier is coupled to an input of the fourth adder; an output of the fourth adder is coupled to an input of the first output node; an output of the first adder is coupled to an input of the second adder; an output of the first delay element is coupled to an input of the second delay element, an input of the third multiplier and an input of the third adder; an output of the third multiplier is coupled to an input of the third adder; an output of the third adder is coupled to an input of the fourth multiplier; an output of the fourth multiplier is coupled to an input of the second adder 718); an output of the second adder is coupled to an input of the fourth adder and an input of the fifth adder; an output of the second delay element is coupled to an input of the first adder and to an input of the second multiplier; an output of the second multiplier is coupled to an input of the fifth adder; and an output of the fifth adder is coupled to an input of the second output node.

In example 14, the filter of example 12 optionally further comprises a first input node, a second input node, a first multiplier, a second multiplier, a third multiplier, a fourth multiplier, a first delay element, a second delay element, a first adder, a second adder, a third adder, a fourth adder and a fifth adder, wherein the first input node is coupled to an input of the first multiplier and an input of the first adder; the second input node is coupled to an input of the second multiplier an input of the first adder; an output of the first adder is coupled to an input of the fourth multiplier, an input of the second adder and an input of the fifth adder; an output of the first multiplier is coupled to an input of the fifth adder; an output of the second multiplier is coupled to an input of the second adder; an output of the second adder is coupled to an input of the delay element; an output of the delay element is coupled to an input of the fourth adder; an output of the fourth multiplier is coupled to an input of the third multiplier and an input of the third adder; an output of the third multiplier is coupled to an input of the third adder; an output of the third adder is coupled to an input of the fourth adder; an output of the fourth adder is coupled to an input of the second delay element; an output of the second delay element is coupled to an input of the fifth adder.

In example 15, in the filter of example 13 or 14, the first multiplier the second multiplier and the third multiplier are configured to perform a multiplication by four; and the fourth multiplier is configured to perform a multiplication by two.

In example 16, in the filter of any of the previous examples, at least one filter of the first filter and the second filter optionally shares at least one element of a multiplier and a delay element with the supplementary filter.

In example 17, the filter of any of examples 6, 10 or 14 optionally further comprises a coupling element configured to couple the first input node to a common input node of the filter at a first sampling interval and the second input node to a common input node of the filter at a subsequent second sampling interval.

In example 18, the filter of any of examples 5, 9 or 13, optionally further comprises a coupling element configured to couple the first output node to a common output node of the filter at a first sampling interval and the second output node to a common output node of the filter at a subsequent second sampling interval.

In example 19, the filter of any of the previous examples, the filter is a digital filter.

Example 20 is a method for providing a filter having an impulse response, comprising: determining a first partial impulse response contributing to the impulse response; determining a second partial impulse response contributing to the impulse response; determining a common contribution to the first partial impulse response and the second partial impulse response; determining a supplementary filter providing the common contribution as a supplementary impulse response; determining a first filter providing the first partial impulse response using the common contribution of the supplementary filter as an input; and determining a second filter providing the second partial impulse response using the common contribution of the supplementary filter as an input.

In example 21, the method of example 20 optionally further comprises combining the supplementary filter, the first filter and the second filter to provide the filter.

Example 22 is a means for filtering with an impulse response comprising a first partial impulse response and a second partial impulse response, comprising means having a supplementary impulse response; means having the first partial impulse response using an output of the means having a supplementary impulse response as an input; and means having the second partial impulse response using an output of the means having a supplementary impulse response as an input.

In example 23, the means of example 22, optionally further comprises means for combining an output of the means having the first partial impulse response and of the means having the second partial impulse response.

Example 24 is a computer program having a program code for performing the method of any of examples 20 or 21, when the computer program is executed on a computer or processor.

Example 25 is a computer readable storage medium having stored thereon a program having a program code for performing the method of any of examples 20 or 21, when the computer program is executed on a computer or processor.

Example 26 is transmitter having a filter of any of examples 1 to 19.

In example 27 is mobile telecommunications device having a transmitter according to example 26.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A filter having an impulse response of a function that comprises a first partial impulse response and a second partial impulse response, comprising:
    a supplementary filter, comprising a digital processing circuitry including at least one output node for an output of the supplementary filter, configured to generate a supplementary impulse response via the digital processing circuitry at the at least one output node;
    a first filter, comprising an additional digital processing circuitry including at least one input node coupled to the supplementary filter, configured to generate, by the additional digital processing circuitry, the first partial impulse response using the output at the at least one output node of the supplementary filter and at least one additional input at the at least one input node as inputs of the first filter; and
    a second filter, comprising a further digital processing circuitry including at least one additional input node coupled to the supplementary filter, configured to generate, by the further digital processing circuitry, the second partial impulse response using the output at the at least one output node of the supplementary filter and the at least one additional input at the at least one additional input node as inputs of the second filter;
    wherein the digital processing circuitries comprise at least a multiplier, a delay element, and an adder; and
    wherein the supplementary filter, the first filter and the second filter combine to provide the impulse response.

2. The filter of claim 1, wherein samples of the impulse response are given by samples of the first partial impulse response at first sample positions and by samples of the second partial impulse response at second sample positions.

3. The filter of claim 2, wherein the first sample positons are uneven sample positions, and wherein the second sample positions are even sample positions.

4. The filter of claim 1, wherein the impulse response is given by positive integer powers$(1-z^{-1})^N$ with N being a positive integer number and $z^{-1}$ denoting a delay by a single sampling period.

5. The filter of claim 4, wherein N=3 and
    the first filter has an impulse response of [2 0];
    the second filter has an impulse response of [0 2]; and
    the supplementary filter has an impulse response of [1 1].

6. The filter of claim 5, comprising an input node, a delay element, a first multiplier, a second multiplier, a first adder, a second adder, a third adder, a first output node and a second output node, wherein the input node is coupled to an input of the first adder, an input of the delay element and an input of the first multiplier;

an output of the first multiplier is coupled to an input of the third adder;

an output of the third adder is coupled to the first output node;

an output of the delay element is coupled to an input of the second multiplier and to an input of the first adder;

an output of the first adder is coupled to an input of the third adder and to an input of the second adder;

an output of the second multiplier is coupled to an input of the second adder; and an output of the second adder is coupled to the second output node.

7. The filter of claim 6, wherein the first multiplier and the second multiplier are configured to perform a multiplication by two.

8. The filter of claim 5, comprising a first input node, a second input node, a first multiplier, a second multiplier, a delay element, a first adder, a second adder and a third adder, wherein the first input node is coupled to an input of the first multiplier and to an input of the first adder;

the second input node is coupled to an input of the second multiplier and to an input of the first adder;

an output of the first multiplier is coupled to an input of the third adder;

an output of the second multiplier is coupled to an input of the second adder;

an output of the second adder is coupled to an input of the delay element;

an output of the delay element is coupled to an input of the third adder;

an output of the first adder is coupled to an input of the second adder and to an input of the third adder.

9. The filter of claim 4, wherein N=4 and the first filter has an impulse response of [0 4 0];

the second filter has an impulse response of [4]; and the supplementary filter has an impulse response of [1 1].

10. The filter of claim 9, comprising an input node, a first delay element, a second delay element, a first multiplier, a second multiplier, a first adder, a second adder, a third adder, a first output node and a second output node, wherein the input node is coupled to an input of the first adder and to an input of the first delay element;

an output of the first delay element is coupled to an input of the first adder an input of the first multiplier;

an output of the first multiplier is coupled to an input of the third adder;

an output of the first adder is coupled to an input of the second delay element, an input of the second adder and to the second output node;

an output of the second delay element is coupled to an input of the second adder;

an output of the second adder is coupled to an input of the third adder;

an output of the third adder is coupled to an input of the second multiplier; and an output of the second multiplier is coupled to the second output node.

11. The filter of claim 10, wherein the first multiplier and the second multiplier are configured to perform a multiplication by four.

12. The filter of claim 9, comprising first input node, a second input node, a first multiplier, a second multiplier, a first delay element, a second delay element, a first adder, a second adder, a third adder and a fourth adder, wherein the first input node is coupled to an input of the first multiplier, an input of the first delay element and an input of the first adder;

the second input node is coupled to an input of the second multiplier;

an output of the second multiplier is coupled to an input of the first adder;

an output of the first adder is coupled to an input of the second adder;

an output of the first delay element is coupled to an input of the second adder;

an output of the first multiplier is coupled to an input of the third adder;

an output of the second adder is coupled to an input of the third adder and an input of the fourth adder;

an output of the third adder is coupled to an input of the second delay element; and an output of the second delay element is coupled to an input of the fourth adder.

13. The filter of claim 4, wherein N=5 and the first filter has an impulse response of [4 0 0];

the second filter has an impulse response of [0 0 4]; and the supplementary filter has an impulse response of [1 10 1].

14. The filter of claim 13, comprising an input node, a first delay element, a second delay element, a first multiplier, a second multiplier, a third multiplier, a fourth multiplier, a first adder, a second adder, a third adder, a fourth adder, a fifth adder, first output node and a second output node, wherein the input node is coupled to an input of the first delay element, an input of the first multiplier and an input of the first adder;

an output of the first multiplier is coupled to an input of the fourth adder;

an output of the fourth adder is coupled to an input of the first output node;

an output of the first adder is coupled to an input of the second adder;

an output of the first delay element is coupled to an input of the second delay element, an input of the third multiplier and an input of the third adder;

an output of the third multiplier is coupled to an input of the third adder;

an output of the third adder is coupled to an input of the fourth multiplier;

an output of the fourth multiplier is coupled to an input of the second adder;

an output of the second adder is coupled to an input of the fourth adder and an input of the fifth adder;

an output of the second delay element is coupled to an input of the first adder and to an input of the second multiplier;

an output of the second multiplier is coupled to an input of the fifth adder; and an output of the fifth adder is coupled to an input of the second output node.

15. The filter of claim 14, wherein the first multiplier the second multiplier and the third multiplier are configured to perform a multiplication by four; and the fourth multiplier is configured to perform a multiplication by two.

16. The filter of claim 13, comprising a first input node, a second input node, a first multiplier, a second multiplier, a third multiplier, a fourth multiplier, a first delay element, a second delay element, a first adder, a second adder, a third adder, a fourth adder and a fifth adder, wherein
- the first input node is coupled to an input of the first multiplier and an input of the first adder;
- the second input node is coupled to an input of the second multiplier an input of the first adder;
- an output of the first adder is coupled to an input of the fourth multiplier, an input of the second adder and an input of the fifth adder;
- an output of the first multiplier is coupled to an input of the fifth adder;
- an output of the second multiplier is coupled to an input of the second adder;
- an output of the second adder is coupled to an input of the delay element;
- an output of the delay element is coupled to an input of the fourth adder;
- an output of the fourth multiplier is coupled to an input of the third multiplier and an input of the third adder;
- an output of the third multiplier is coupled to an input of the third adder;
- an output of the third adder is coupled to an input of the fourth adder;
- an output of the fourth adder is coupled to an input of the second delay element;
- an output of the second delay element is coupled to an input of the fifth adder.

17. The filter of claim 1, wherein at least one filter of the first filter and the second filter shares at least one element of a multiplier and a delay element with the supplementary filter.

18. The filter of claim 1, wherein the filter is a digital filter.

19. A method for a filter having an impulse response, comprising:
- generating, via the filter, a first partial impulse response contributing to the impulse response;
- generating, via the filter, a second partial impulse response contributing to the impulse response;
- generating, via the filter, a common contribution to the first partial impulse response and the second partial impulse response;
- providing, via a supplementary filter comprising a digital processing circuitry including at least one output node for an output of the supplementary filter, the common contribution as a supplementary impulse response;
- providing, via a first filter comprising an additional digital processing circuitry including at least one input node coupled to the supplementary filter, the first partial impulse response using the common contribution at the at least one output node of the supplementary filter and at least one additional input at the at least one input node as inputs of the first filter;
- providing, via a second filter comprising a further digital processing circuitry including at least one additional input node coupled to the supplementary filter, the second partial impulse response using the common contribution at the at least one output node of the supplementary filter and the at least one additional input at the at least one additional input node as inputs of the second filter; and
- combining the supplementary filter, the first filter and the second filter to provide the impulse response,
- wherein the digital processing circuitries comprise at least a multiplier, a delay element, and an adder.

20. A computer readable non-transitory storage medium having stored thereon a program having a program code comprising executable instructions for performing the method of claim 19, when the program code comprising executable instructions of the computer program is executed on a computer or processor.

21. A means for filtering with an impulse response comprising a first partial impulse response and a second partial impulse response, comprising:
- means for generating a supplementary impulse response;
- means for generating the first partial impulse response using an output of the means for generating the supplementary impulse response and at least one additional input as inputs of the first filter;
- means for generating the second partial impulse response using an output of the means for generating the supplementary impulse response and the at least one additional input as inputs of the second filter; and
- means for combining an output of the means having the first partial impulse response and of the means having the second partial impulse response.

* * * * *